(12) United States Patent
Cheng et al.

(10) Patent No.: US 10,170,498 B2
(45) Date of Patent: *Jan. 1, 2019

(54) STRAINED CMOS ON STRAIN RELAXATION BUFFER SUBSTRATE

(71) Applicant: International Business Machines Corporation, Armonk, NY (US)

(72) Inventors: Kangguo Cheng, Schenectady, NY (US); Balasubramanian Pranatharthiharan, Watervliet, NY (US); Juntao Li, Cohoes, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/790,037

(22) Filed: Oct. 22, 2017

(65) Prior Publication Data

US 2018/0069026 A1 Mar. 8, 2018

Related U.S. Application Data

(63) Continuation of application No. 15/255,821, filed on Sep. 2, 2016, now Pat. No. 9,853,056.

(51) Int. Cl.
*H01L 21/00* (2006.01)
*H01L 21/84* (2006.01)
(Continued)

(52) U.S. Cl.
CPC ...... *H01L 27/1211* (2013.01); *H01L 21/0217* (2013.01); *H01L 21/02532* (2013.01);
(Continued)

(58) Field of Classification Search
CPC ......... H01L 27/1211; H01L 21/823878; H01L 21/845; H01L 29/7846; H01L 21/02532;
(Continued)

(56) References Cited

U.S. PATENT DOCUMENTS 8,269,283 B2 * 9/2012 Cea ................ H01L 21/76224
257/213
8,766,364 B2 7/2014 Doornbus et al.
(Continued)

OTHER PUBLICATIONS

I. Ok et al., "Strained SiGe and Si FinFETs for high performance logic with SiGe/Si stack on SOI," International Electron Devices Meeting (IEDM), 2010, 34.2, 4 pages.
(Continued)

*Primary Examiner* — Marcos D Pizarro
*Assistant Examiner* — Nelson Garces
(74) *Attorney, Agent, or Firm* — Jeffrey S LaBaw; Steven J Meyers

(57) ABSTRACT

A method for constructing an advanced FinFET structure is described. A first long silicon fin for n-type FinFET devices and a first long silicon germanium fin for p-type FinFET devices are provided on a strain relaxation buffer (SRB) substrate. The first long silicon fin is cut forming a first and a second cut silicon fin so that the first and second cut silicon fin have a vertical face at a fin end. The first long silicon germanium fin is cut forming a first and a second cut silicon germanium fin, the first and the second cut silicon germanium cut fin have a vertical face at a fin end. A tensile dielectric structure is formed which contacts the vertical faces of the first and second cut silicon fins to maintain tensile strain in the first and second cut silicon fins. A compressive dielectric structure is formed which contacts the vertical faces of the silicon germanium fins to maintain compressive strain in the first and second cut silicon germanium fins.

15 Claims, 11 Drawing Sheets

(51) Int. Cl.
*H01L 29/78* (2006.01)
*H01L 27/12* (2006.01)
*H01L 21/70* (2006.01)
*H01L 27/092* (2006.01)
*H01L 21/8238* (2006.01)
*H01L 21/02* (2006.01)
*H01L 21/762* (2006.01)
*H01L 21/3105* (2006.01)
*H01L 29/06* (2006.01)
*H01L 29/10* (2006.01)
*H01L 29/16* (2006.01)
*H01L 29/161* (2006.01)

(52) U.S. Cl.
CPC .. *H01L 21/31051* (2013.01); *H01L 21/76224* (2013.01); *H01L 21/823821* (2013.01); *H01L 21/823878* (2013.01); *H01L 21/845* (2013.01); *H01L 27/0924* (2013.01); *H01L 29/0649* (2013.01); *H01L 29/1054* (2013.01); *H01L 29/16* (2013.01); *H01L 29/161* (2013.01); *H01L 29/7843* (2013.01); *H01L 29/7846* (2013.01)

(58) Field of Classification Search
CPC ....... H01L 21/823821; H01L 21/76224; H01L 21/0217; H01L 21/31051; H01L 27/0924; H01L 29/0649; H01L 29/1054; H01L 21/823431; H01L 21/02381; H01L 21/0245; H01L 27/0886; H01L 27/10826; H01L 27/10879; H01L 29/41791; H01L 29/66795–29/66818; H01L 29/785–29/7856; H01L 2924/13067; H01L 29/16–29/1608; H01L 29/7843
USPC .................................................. 257/346–356
See application file for complete search history.

(56) References Cited

U.S. PATENT DOCUMENTS

| | | | |
|---|---|---|---|
| 8,951,870 B2 | 2/2015 | Basker et al. | |
| 8,975,168 B2 | 3/2015 | Liu et al. | |
| 9,093,533 B2 | 7/2015 | Cheng et al. | |
| 9,431,539 B2 * | 8/2016 | Qi | H01L 29/7849 |
| 9,853,056 B1 * | 12/2017 | Cheng | H01L 27/1211 |
| 2013/0264653 A1 * | 10/2013 | Cai | 257/369 |
| 2014/0151766 A1 | 6/2014 | Eneman et al. | |
| 2014/0353760 A1 | 12/2014 | Loubet et al. | |
| 2015/0079803 A1 | 3/2015 | Huang et al. | |
| 2015/0318355 A1 | 11/2015 | Wang et al. | |

OTHER PUBLICATIONS

K. Cheng et al., "High performance extremely thin SOI (ETSOI) hybrid CMOS with Si channel NFET and strained SiGe channel PFET," International Electron Devices Meeting (IEDM), 2012, 18.1, 4 pages.
IBM Patents or Patent Applications Treated as Related.

* cited by examiner

US 10,170,498 B2

STRAINED CMOS ON STRAIN RELAXATION BUFFER SUBSTRATE

BACKGROUND OF THE INVENTION

This disclosure relates to integrated circuit devices, and more specifically, to a method and structure to create advanced silicon (Si) and silicon germanium (SiGe) FinFET structures in semiconductor devices.

As the dimensions of modern integrated circuitry in semiconductor chips continues to shrink, conventional lithography is increasingly challenged to make smaller and smaller structures. With the reduced size of the integrated circuit, packaging the chips more closely together becomes important as well. By placing chips closer to each other, the performance of the overall computer system is improved.

FinFET (Fin Field Effect Transistor) has become a preferred CMOS technology at 22 nm. The semiconductor industry has found an alternative approach to planar FETs with FinFETs to reduce leakage current in semiconductor devices. In a FinFET, an active region including the drain, the channel region and the source protrudes up in a "fin" from the surface of the semiconductor substrate upon which the FinFET is located. Due to the many superior attributes, especially in the areas of device performance, off-state leakage and foot print, FinFETs are replacing planar FETs. CMOS FinFET devices have both FinFETs which use n-channels (nFETs) and FinFETs which use p-channels (pFETs).

Strain engineering is highly desired for boosting CMOS performance in FinFET technologies. To boost performance, tensile strain is beneficial for nFET devices and compressive strain is beneficial for pFET devices. Strained compressive high germanium percentage SiGe materials and strained tensile silicon material grown on strain relaxation buffer (SRB) substrates have been touted as a device option for small geometries. However, when SiGe or Si fins are cut into desired lengths, the desired strain relaxes at the fin ends. The loss of strain at SiGe or Si fin ends causes device degradation and variations in device performance.

Therefore, there is a need to fabricate SiGe and Si fins without the fin ends strain relaxation issue.

BRIEF SUMMARY

According to this disclosure, a method for constructing an advanced FinFET structure is described. A first long silicon fin for n-type FinFET devices and a first long silicon germanium fin for p-type FinFET devices are provided on a strain relaxation buffer (SRB) substrate. The first long silicon fin is cut forming a first and a second cut silicon fin so that the first and second cut silicon fin have a vertical face at a fin end. The first long silicon germanium fin is cut forming a first and a second cut silicon germanium fin, the first and the second cut silicon germanium cut fin have a vertical face at a fin end. A tensile dielectric structure is formed which contacts the vertical faces of the first and second cut silicon fins to maintain tensile strain in the first and second cut silicon fins. A compressive dielectric structure is formed which contacts the vertical faces of the silicon germanium fins to maintain compressive strain in the first and second cut silicon germanium fins.

The foregoing has outlined some of the more pertinent features of the disclosed subject matter. These features should be construed to be merely illustrative. Many other beneficial results can be attained by applying the disclosed subject matter in a different manner or by modifying the invention as will be described.

BRIEF DESCRIPTION OF THE DRAWINGS

For a more complete understanding of the present invention and the advantages thereof, reference is now made to the following descriptions taken in conjunction with the accompanying drawings which are not necessarily drawing to scale, and in which.

DETAILED DESCRIPTION OF THE DRAWINGS

Figure 1:
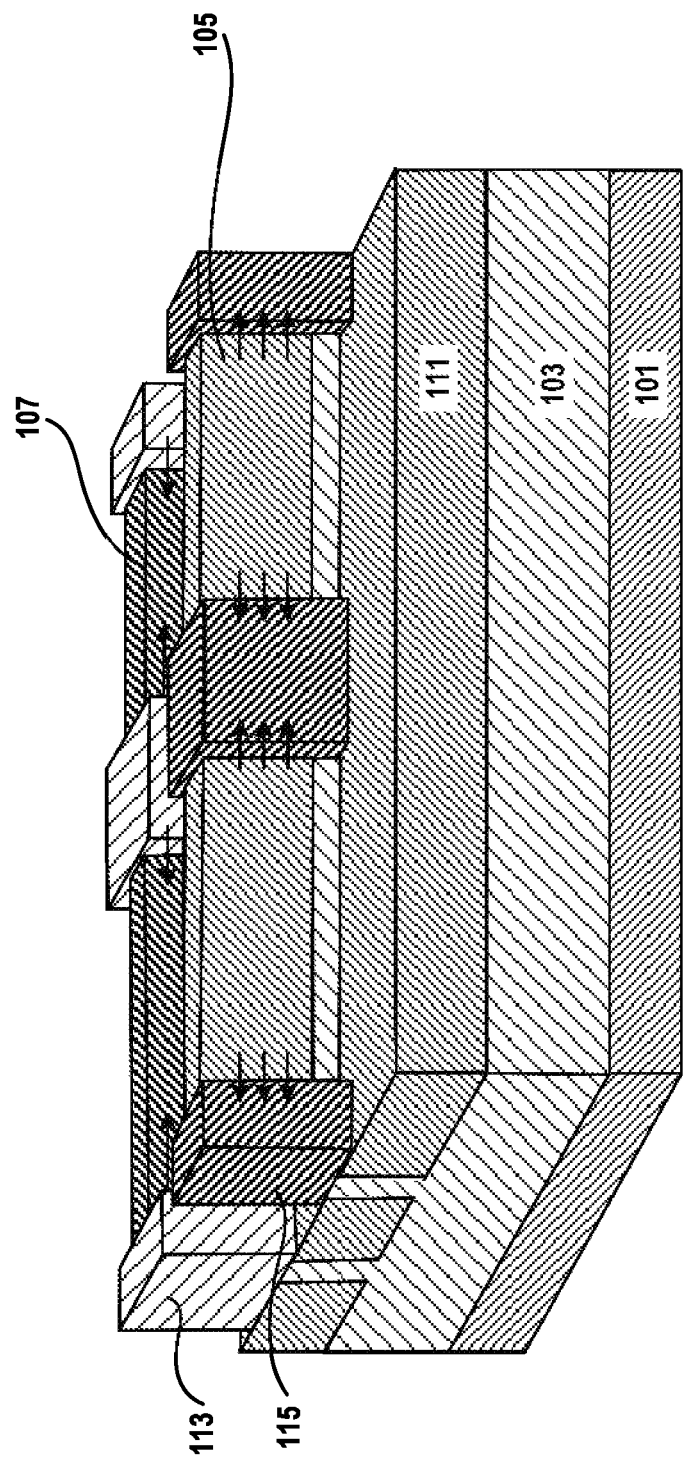
FIG. 1 is a perspective diagram depicting the structure after compressive nitride and tensile nitride have been formed according to a first embodiment of the invention.

At a high level, the invention provides a method and resulting structure provides a method and structure for forming tensile strained nFETs and compressive strained pFETs on the same substrate. The silicon germanium fins have compressive nitride fill at fin ends to maintain and enhance compressive strain in SiGe fins for p-type FinFETs. Silicon fins have tensile nitride fill at fin ends to maintain and enhance tensile strain in Si fins for n-type FinFETs.

A "substrate" as used herein can comprise any material appropriate for the given purpose (whether now known or developed in the future) and can comprise, for example, Si, SiC, SiGe, SiGeC, Ge alloys, GaAs, InAs, InP, other III-V or II-VI compound semiconductors, or organic semiconductor structures. Insulators can also be used as substrates in embodiments of the invention. It should also be understood that material compounds will be described in terms of listed elements, e.g., SiGe. These compounds include different proportions of the elements within the compound, e.g., SiGe includes $Si_xGe_y$. In addition, other elements may be included in the compound and still function in accordance with the present principles. The compounds with additional elements will be referred to herein as "alloys".

For purposes herein, a "semiconductor" is a material or structure that may include an implanted impurity that allows the material to sometimes be conductive and sometimes be a non-conductive, based on electron and hole carrier concentration. As used herein, "implantation processes" can take any appropriate form (whether now known or developed in the future) and can comprise, for example, ion implantation.

For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned. Alternatively, the dielectrics herein may be formed from any of the many candidate high dielectric constant (high-k) materials, including but not limited to hafnium oxide, aluminum oxide, silicon nitride, silicon oxynitride, a gate dielectric stack of SiO2 and Si3N4, and metal oxides like tantalum oxide that have relative dielectric constants above that of SiO2 (above 3.9). The dielectric can be a combination of two or more of these materials. The thickness of dielectrics herein may vary contingent upon the required device performance. The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art.

When patterning any material herein, the material to be patterned can be grown or deposited in any known manner and a patterning layer (such as an organic photoresist aka "resist") can be formed over the material. The patterning layer (resist) can be exposed to some form of light radiation (e.g., patterned exposure, laser exposure) provided in a light exposure pattern, and then the resist is developed using a chemical agent. This process changes the characteristic of the portion of the resist that was exposed to the light. Then one portion of the resist can be rinsed off, leaving the other portion of the resist to protect the material to be patterned. A material removal process is then performed (e.g., plasma etching) to remove the unprotected portions of the material to be patterned. The resist is subsequently removed to leave the underlying material patterned according to the light exposure pattern.

For purposes herein, "sidewall structures" are structures that are well-known to those ordinarily skilled in the art and are generally formed by depositing or growing a conformal insulating layer (such as any of the insulators mentioned above) and then performing a directional etching process (anisotropic) that etches material from horizontal surfaces at a greater rate than its removes material from vertical surfaces, thereby leaving insulating material along the vertical sidewalls of structures. This material left on the vertical sidewalls is referred to as a sidewall structure. The sidewall structures can be used as masking structures for further semiconducting processing steps.

Embodiments will be explained below with reference to the accompanying drawings.

FIG. 1 is a perspective diagram depicting the structure after compressive nitride and tensile nitride have been formed according to a first embodiment of the invention. The structure is built on a substrate 101, for example, a bulk silicon wafer, on which a strain relaxation buffer (SRB) layer 103 has been grown. Silicon fins 105 and silicon germanium fins 107 are shown disposed on the same wafer. A shallow trench isolation 111 fills trenches located between the fins to electrically isolate them from one another. The Si fins 105 have tensile dielectric (e.g., tensile silicon nitride) fill 115 at fin ends to maintain and enhance tensile strain in Si fins 105 for n-type FinFETs. The SiGe fins 107 have compressive dielectric (e.g., compressive silicon nitride) fill 113 at fin ends to maintain and enhance compressive strain in SiGe fins for p-type FinFETs. Arrows in the drawing represent the direction of force exerted on the respective fins 105, 107 by the respective nitride fills 115, 113.

Figure 2:
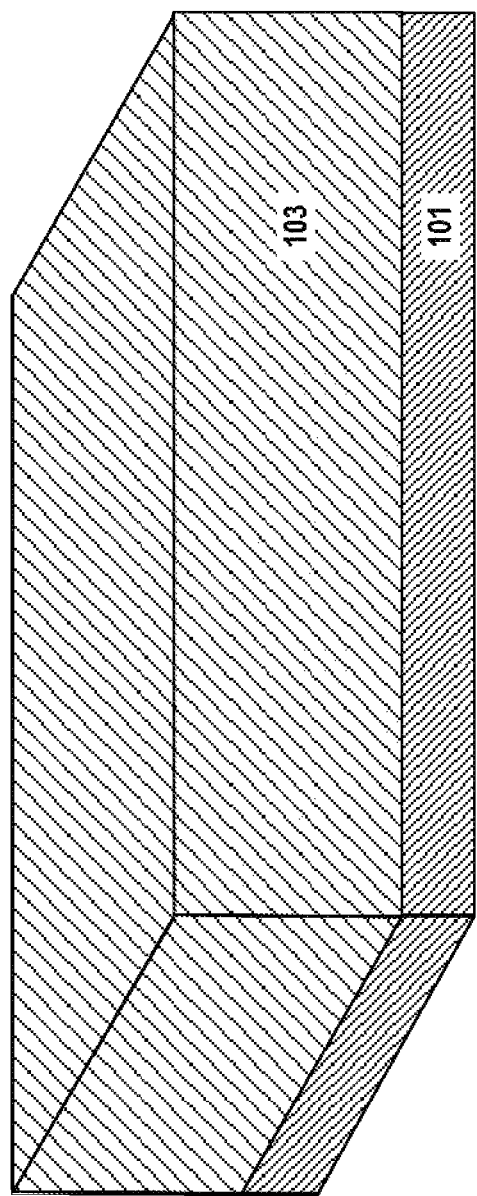
FIG. 2 is a perspective diagram depicting the substrate structure after a SRB layer has been formed on a substrate according to a first embodiment of the invention.

FIG. 2 is a perspective diagram depicting the substrate structure after a strain relaxation buffer (SRB) layer has been formed on a substrate according to a first embodiment of the invention. The structure is built on a substrate 101, for example, a bulk silicon wafer, however, in alternative embodiments any suitable substrate can be used, e.g., silicon-on-insulator. An SRB layer 103 is grown. In some embodiments, the SRB layer 103 may be comprised of a SiGe based material grown in one or more layers. The germanium concentration in the SRB layer 103 may be substantially uniform or vary. In embodiments of the invention, the SRB layer 103 further comprises defects such as dislocations. In some embodiments, defects are primarily located at the lower portion of the SRB layers and the top portion of the SRB layer has fewer defects. The SRB layer 103 is substantially strain-free, meaning the strain in the SRB layer is less than 0.2%. In some embodiments, the germanium concentration of the SRB layer is about 25%.

Figure 3:
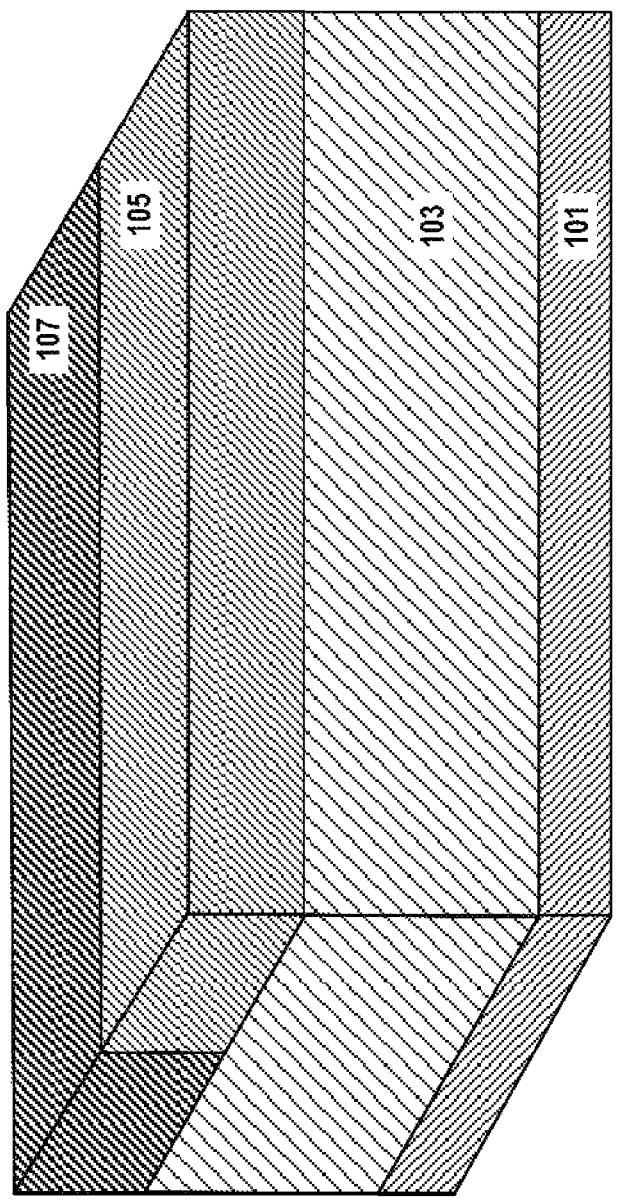
FIG. 3 is a perspective diagram depicting the structure after a silicon region and a silicon germanium region have been formed according to a first embodiment of the invention.

FIG. 3 is a perspective diagram depicting the structure after a silicon region and a silicon germanium region have been formed according to a first embodiment of the invention. In preferred embodiments of the invention, the process grows a silicon layer 105 in the future nFET region and a silicon germanium layer 107 in the future pFET region on top of the SRB layer 103. Conventional patterning steps such as masking the nFET region, depositing a hardmask layer or a photoresist layer, epitaxially growing the SiGe 107 on the SRB layer 103 and stripping of the hardmask and/or photoresist layers are performed in embodiments of the invention. In this process, the pFET region is then masked, depositing a hardmask layer or a photoresist layer, the Si 105 epitaxially grown on the SRB layer 103 and the hardmask and/or photoresist layers are removed. As is known by those skilled in the art, the term "epitaxial" denotes that a material is formed using an epitaxial growth process. Other methods of growing a SiGe layer and Si layer are known to the art and can be used in embodiments of the invention. Conventionally, in an epitaxial growth and/or deposition process, the growth of a material on a surface of a semiconductor material, in which the material being grown has the same crystalline characteristics, e.g., crystalline plane orientation, as the semiconductor material.

The Ge content in the SiGe layer 107 is greater than the Ge content in the SRB layer 103. In some embodiments, the Ge content in the SiGe layer 107 can range from 30% to 90% (atomic concentration) and preferably ranges from 30% to 60%. In embodiments of the invention, the Si layer 105 and SiGe layer 107 have a thickness from 20 nm to 150 nm with a thickness from 50 nm to 80 nm being preferred. The epitaxial Si layer is tensily strained and the epitaxial SiGe is compressively strained.

Figure 4:
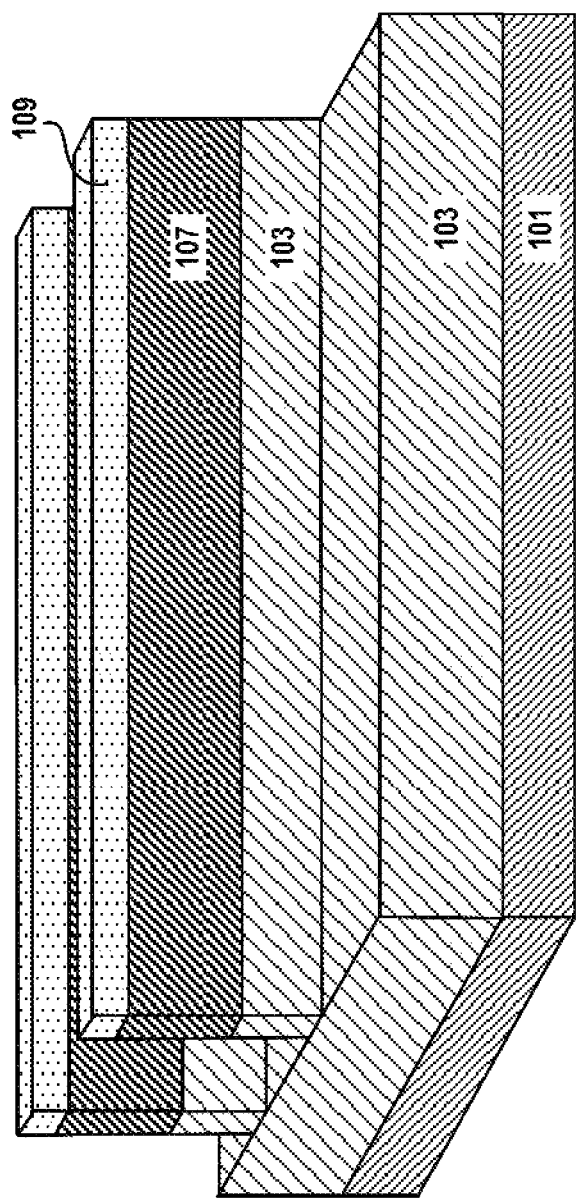
FIG. 4 is a perspective diagram depicting the structure after SiGe fins have been formed according to a first embodiment of the invention.

FIG. 4 is a cross-sectional diagram depicting the substrate structure after a patterning step has been performed forming Si fins and SiGe fins according to a first embodiment of the invention. In preferred embodiments of the invention, a hardmask layer 109 is deposited and patterned over the Si 105 (not shown) and SiGe 107 regions of the substrate. For clarity, only the SiGe portion of the substrate is shown in the drawing. In embodiments of the invention, the hardmask layer 109 is comprised of silicon nitride, with a typical thickness of 30-50 nm. The hardmask width ranges from 5 nm to 20 nm to achieve the correct thickness of the fins, with widths of 10-15 nm being preferred in some embodiments. The hardmask layer 109 is deposited, for example, by a low pressure chemical vapor deposition (LPCVD) process or any other suitable deposition technique. However, hardmask layer 109 can be comprised of any material in a range of thicknesses that can act as a hardmask during etching of the Si 105 (not shown) and SiGe 107 regions. The hardmask layer 105 is patterned so that a respective mask is formed where each of a first set of Si fins are formed in the Si region and a second set of SiGe fins are formed in the SiGe region using an etch process. Any suitable patterning technique can be used to form fins. For example, a sidewall image transfer process can be employed to pattern the hardmask 105. Alternatively, the fin pattern can be formed by direct lithography (e.g., extreme ultraviolet (EUV)) followed by reactive ion etch (RIB). In preferred embodiments of the invention, the etch process used to etch the fins is a reactive ion etch (RIE) process using a chlorine or fluorine based chemistry in some embodiments of the invention. As illustrated, the etch forming the fins in the SiGe 107 region etches through the SiGe layer 107 and into the SRB layer 103, although other embodiments of the invention stop the fin etch at the SRB layer interface. At this point in the process, the fin height is in the range of 20-100 nm, with fin heights in the range of 30-80 nm being more preferred.

Figure 5:
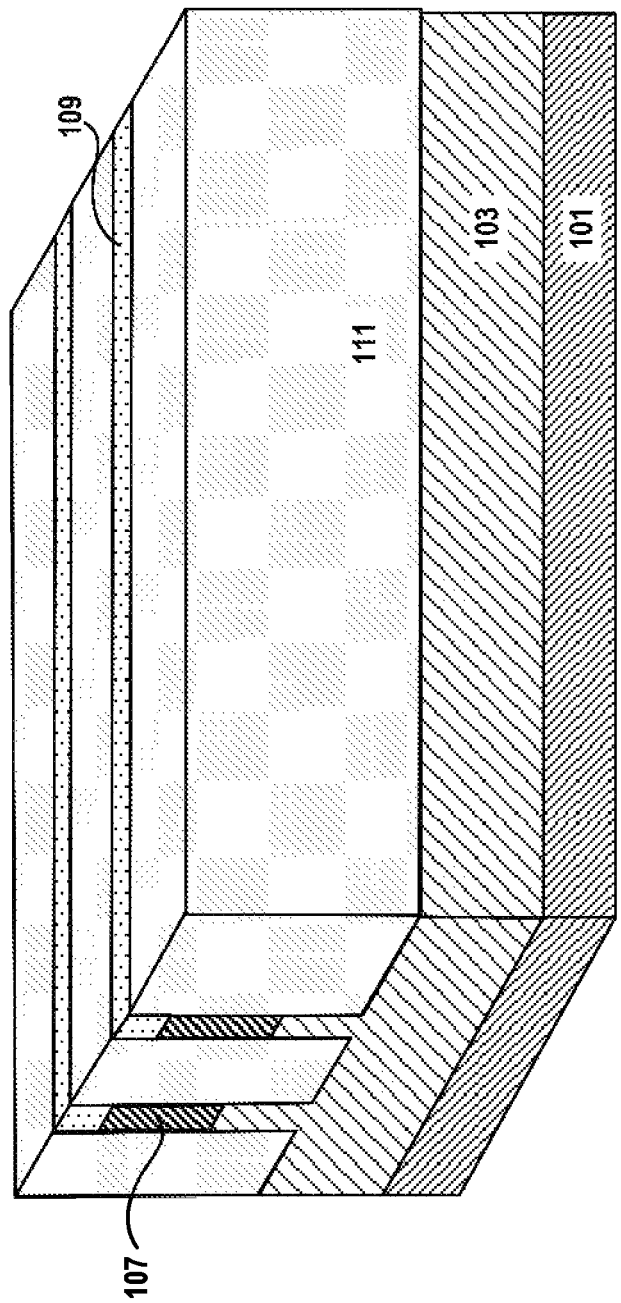
FIG. 5 is a perspective diagram depicting the structure after shallow trench isolation and planarization steps have been performed for the silicon germanium fins according to a first embodiment of the invention.

FIG. 5 is a perspective diagram depicting the structure after shallow trench isolation deposition and planarization steps have been performed for the silicon germanium fins according to a first embodiment of the invention. In some embodiments, oxide 111 is deposited and flows into the trench areas between the fins 107 to provide electrical insulation between the fins. The oxide 111 can be for example, a flowable oxide, e.g., a polymer hydrogen silsesquioxane (HSQ) or a carbon doped silicon oxide. Alternatives to flowable oxide used in other embodiments include, but are not limited to, spin-on-glass, and dielectrics created by CVD, HDP-CVD (high-density plasma CVD), PECVD (plasma-enhanced CVD) processes. In some embodiments, a combination of those processes is used to fill gaps. In some embodiments, a cyclic process of deposition/recess can be used to fill gaps. In preferred embodiments of the invention, a densification anneal is performed to enhance densification of the flowable oxide 111. In one embodiment, the densification anneal may be performed at a temperature ranging from about 400 degrees Celsius to about 800 degrees Celsius. In another embodiment, the densification anneal may be performed at a temperature ranging from about 900 degrees Celsius to about 1100 degrees Celsius.

The drawing depicts the structure after a planarization process such as a chemical mechanical polishing (CMP) step has been performed according to a first embodiment of the invention. Typically, a CMP process uses an abrasive and corrosive chemical slurry (commonly a colloid) in conjunction with a polishing pad. The pad and wafer are pressed together by a dynamic polishing head and held in place by a plastic retaining ring. As shown, the CMP step has removed the excess portions of the oxide 111 so that it is coplanar with the top of the hardmask layer 109. Other planarization processes are known to the art and are used in alternative embodiments of the invention.

Figure 6:
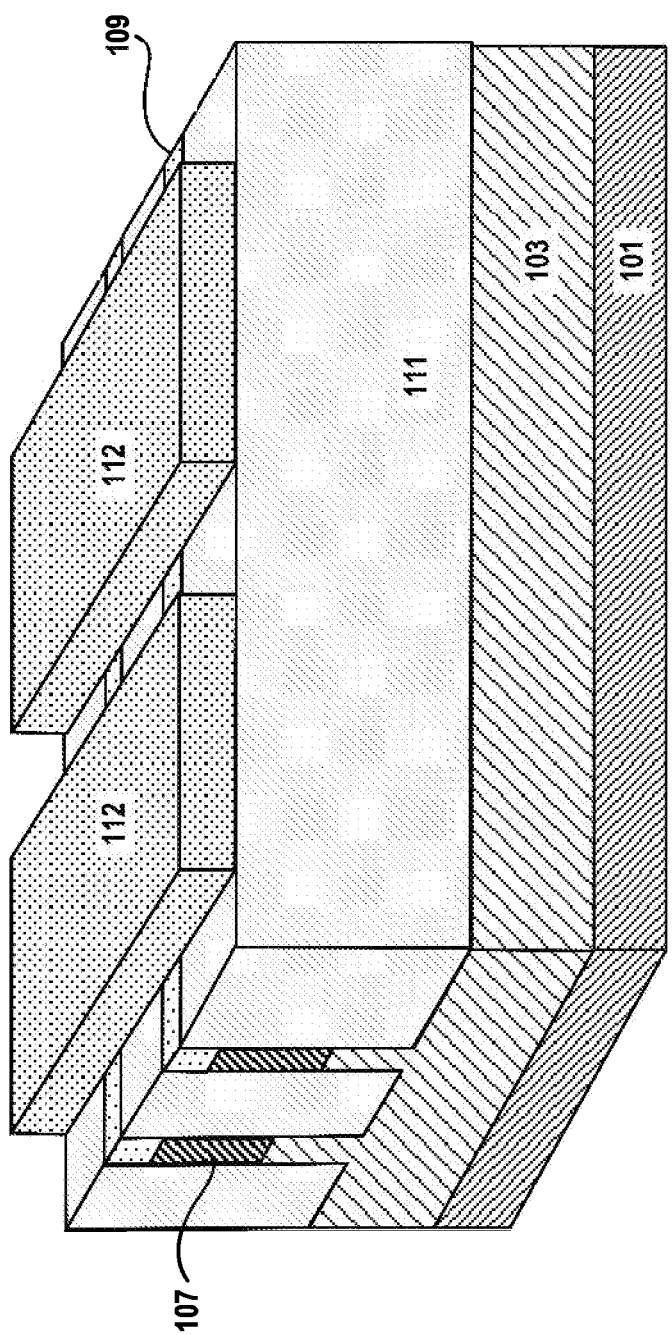
FIG. 6 is a perspective diagram depicting the structure after a fin cut mask step has been formed for the silicon germanium fins according to a first embodiment of the invention.

FIG. 6 is a perspective diagram depicting the structure after a fin cut mask deposition and patterning step has been formed for the silicon germanium fins according to a first embodiment of the invention. The fin cut mask 113 is patterned using conventional techniques to leave openings where the SiGe fins 107 are to be cut according to the device architecture. For example, fin cut mask 113 can be comprised of a lithographically patterned photoresist layer. Alternatively, the fin cut mask 113 could be a hardmask, e.g. silicon nitride, patterned by a photoresist layer or other conventional means.

Figure 7:
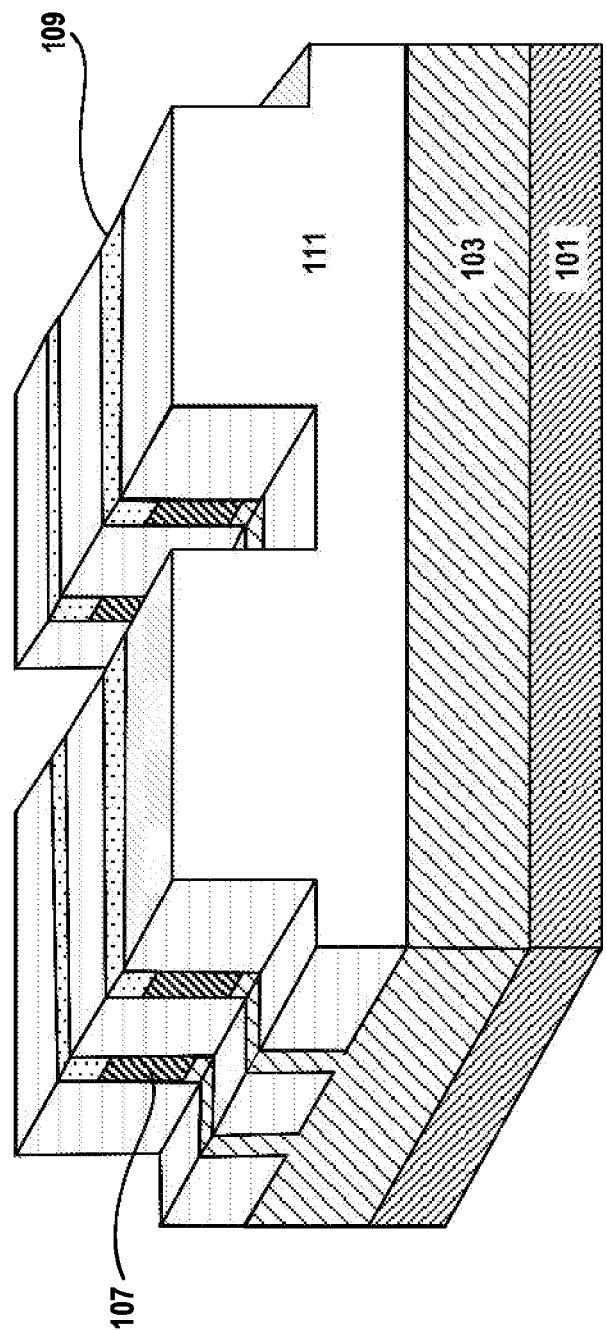
FIG. 7 is a perspective diagram depicting the structure after a fin cut RIE and a fin cut mask strip step have been performed for the silicon germanium fins according to a first embodiment of the invention.

FIG. 7 is a perspective diagram depicting the structure after a fin cut RIE and a fin cut mask strip step have been performed for the silicon germanium fins according to a first embodiment of the invention. In preferred embodiments of the invention, the etch process used to cut the fins to the correct length is a reactive ion etch (RIB) process using a chlorine or fluorine based chemistry. In this step of the process, the etch cutting the fins in the SiGe 107 region etches through the hardmask 109, through the SiGe layer 107 and into neighboring regions of the SRB layer 103 though not quite to the full height of the fins to form a set of cut SiGe fins and a set of trench features. In preferred embodiments of the invention, the depth of the fin cut should be more than the depth of the final fin channel depth, i.e. the thickness of the SiGe region (or the thickness of the Si region). The depth of the fin cut can be equal to, greater or less than the full height of the fins. The fin cut etch forms a vertical, cut face at the end of each newly defined, cut SiGe fin, between and orthogonal to the vertical faces of the fin sidewalls, and between and orthogonal to the bottom and top faces of the cut fin. In the prior art, at the fin ends after fin cut, strain relaxation occurs. That is, in the prior art, at the fin ends after the fin cut, the desired strain is partially or fully lost. The embodiments of the present invention use stress dielectric to fill the cut regions next to fin ends to retain the strain at fin ends. After the fin cut RIE step, a fin cut mask strip is performed. The etchants used are dependent upon the composition of the fin cut mask, e.g., a photoresist mask can be removed by an ash process. Although a highly directional etch is preferably used to create the cut fin faces at the fin ends, depending upon the variability of process conditions, the cut faces may not be perfectly vertical. It is typical for a chip design to be laid out orthogonally so that features are oriented at 90 degrees from one another, however, in alternative embodiments, the cut faces may not be orthogonally oriented with respect to the sidewalls.

Figure 8:
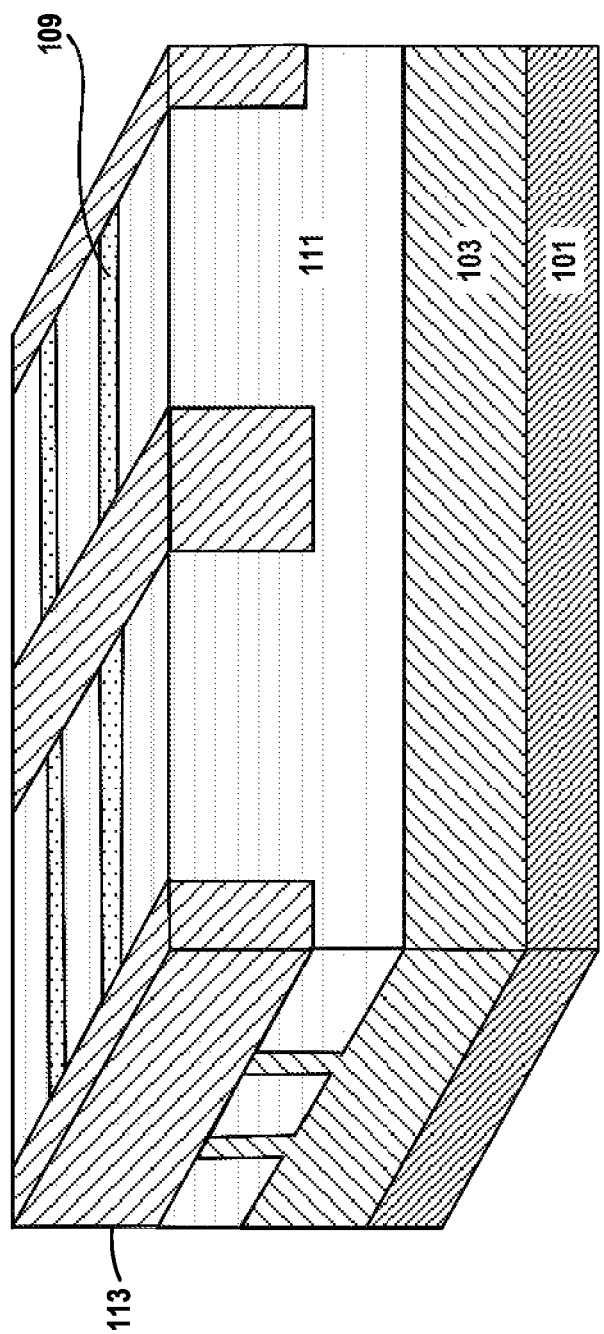
FIG. 8 is a perspective diagram depicting the structure after a compressive nitride deposition step has been performed for the silicon germanium fins according to a first embodiment of the invention.

FIG. 8 is a perspective diagram depicting the structure after a compressive dielectric deposition step has been performed, e.g., a compressive silicon nitride deposition, for the silicon germanium fins according to a first embodiment of the invention. The compressive dielectric 113 fills the trench features cut in the preceding step. A planarization process such as a chemical mechanical polishing (CMP) step is performed after the nitride deposition using the fin hard mask as CMP stop according to a first embodiment of the invention. In preferred embodiments of the invention, the composition of the stress dielectric and the hardmask are chosen to be complementary for the CMP step. If the stress dielectric is nitride, the fin hardmask can be SiOC. If the stress film is oxide, the fin hardmask can be either nitride or SiOC.

The stress dielectric may be formed from a material that induces either compressive or tensile stress.

For the SiGe fins, it is specifically contemplated that a compressive nitride may be used, but it should be understood that alternative compressive stress inducing materials may include amorphous carbon or a compressive oxide. A compressive strain inducing liner may be formed, for example, using PECVD or high density plasma chemical vapor deposition (HDPCVD). In one specific embodiment, PECVD can provide nitride strain inducing liners having a compressive internal strain. The stress state of the deposited nitride strain inducing liner may be set by changing the deposition conditions to alter the reaction rate within the deposition chamber, in which the deposition conditions include gas flow rate, pressure, radio frequency power, and electrode gap.

A silicon nitride stressed material having higher compressive stress values can be obtained by increasing radio frequency (RF) energy bombardment to achieve higher film density by having more Si—N bonds in the deposited material and reducing the density of Si—H and N—H bonds. Higher deposition temperatures and RF power improve the compressive stress levels of the deposited film. In addition, higher compressive stresses levels may be obtained in the deposited material at higher kinetic energy levels of plasma species. Bombardment of energetic plasma species, such as plasma ions and neutrals, generates compressive stresses in the deposited material because film density increases.

For the Si fins, a tensile stress inducing material may be a dielectric that generates a tensile stress on adjacent structures. In one specific example, a tensile stress inducing stress dielectric may be formed from a tensile silicon nitride and may be formed using, e.g., plasma enhanced chemical vapor deposition (PECVD). The PECVD process can provide nitride stress-inducing layers having an intrinsic tensile strain. The stress state of the nitride stress including liners deposited by PECVD can be controlled by changing the deposition conditions to alter the reaction rate within the deposition chamber. More specifically, the stress state of the deposited nitride strain inducing liner may be set by changing the deposition conditions such as: gas flow rate, pressure, radio frequency power, and electrode gap. In another example, rapid thermal chemical vapor deposition (RTCVD) can provide nitride tensile strain inducing dielectric having an internal tensile strain.

The magnitude of the internal tensile strain produced within the nitride tensile strain inducing dielectric deposited by RTCVD can be controlled by changing the deposition conditions. More specifically, the magnitude of the tensile strain within the nitride tensile strain inducing dielectric may be set by changing deposition conditions such as: precursor composition, precursor flow rate, and temperature. Alternative tensile stress inducing materials may include, for example, aluminum oxides, hafnium oxides, zirconium oxides, hafnium silicon oxides, or any combination thereof. A tensile stress inducing material may be a dielectric that generates a tensile stress on adjacent structures.

Figure 9:
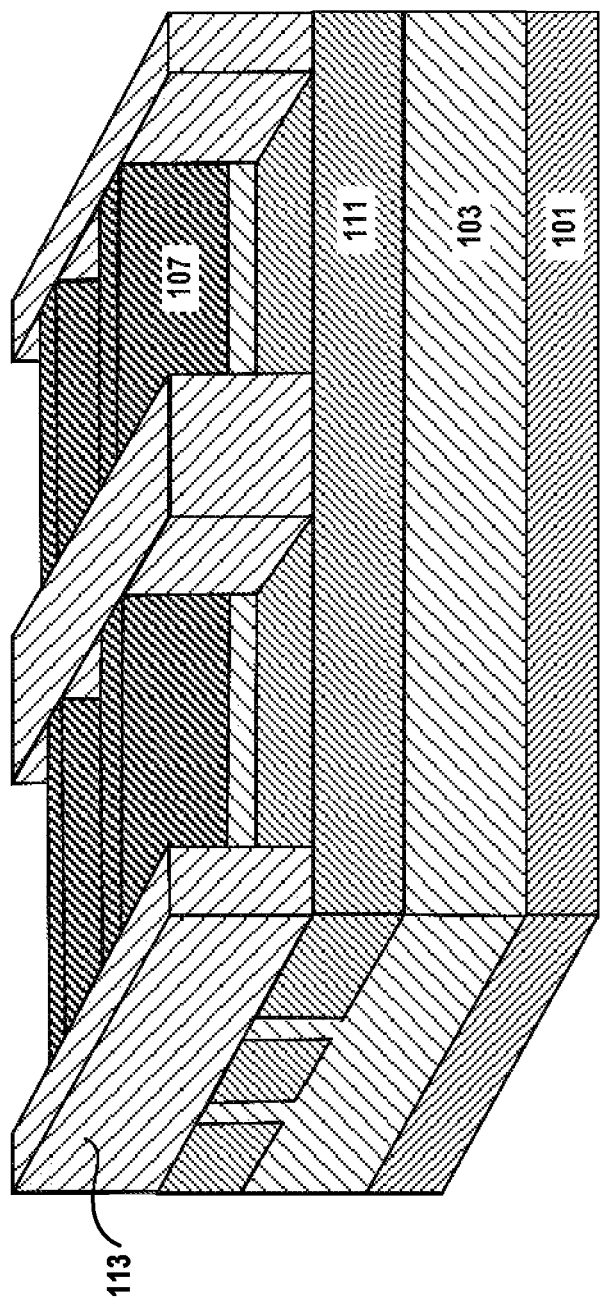
FIG. 9 is a perspective diagram depicting the structure after a STI recess step and pad nitride removal step have been performed for the silicon germanium fins according to a first embodiment of the invention.

FIG. 9 is a perspective diagram depicting the structure after an STI recess step and hardmask nitride removal step have been performed for the silicon germanium fins according to a first embodiment of the invention. The oxide 111 is recessed to form shallow trench isolation (STI). The STI recess process can be performed by wet etch, dry etch, or a combination of both. In preferred embodiments of the invention, a wet etch, e.g., using a hydrofluoric acid (HF) solution, is followed by a reactive ion etch step to perform the recess operation. As shown in the drawing, the recess step recesses the STI oxide 111 lower than the bottom of the SiGe fin channel 107 and above the bottom of the compressive nitride fill 113, although the precise depth achieved by the recess is not a requirement of the invention. It is preferred to have the compressive nitride fill deeper than the SiGe fin channel. The hardmask removal will depend on the material used to create the hardmask and sidewalls. In one embodiment of the invention, the cap is formed of silicon nitride and the hardmask removal will include a nitride strip. Etchants which can be used to strip silicon nitride include phosphoric acid. Other etchants are used in alternative embodiments. As shown in the figure, the compressive nitride 113 maintains the compression on the SiGe fins 107 which is beneficial to their functioning.

Figure 10:
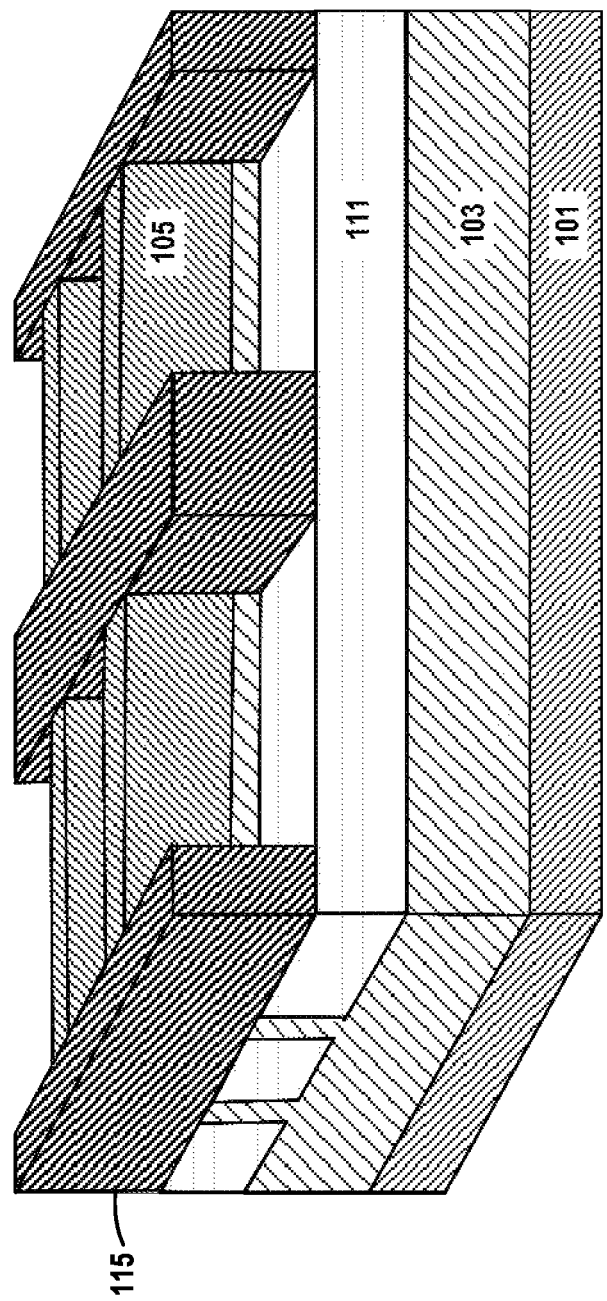
FIG. 10 is a perspective diagram depicting the structure after a STI recess step and pad nitride removal step have been performed for the silicon fins according to a first embodiment of the invention.

FIG. 10 is a perspective diagram depicting the structure after a STI recess step and pad nitride removal step have been performed for the silicon fins according to a first embodiment of the invention. The process for the silicon fins 105 to this point is similar to that described above for the silicon germanium fins, e.g., the long silicon fins are cut into a set of cut silicon fins, a set of trench features are formed in the silicon fins and neighboring STI isolation, filling the trench features with tensile dielectric. Separate fin cut mask and fin cut RIE steps are used from the processing of the silicon germanium fins so that a tensile nitride 115, or other tensile dielectric, can be deposited for the silicon nitride fins 105. The fin cut etch forms a vertical face at the end of each newly defined, cut Si fin, which is orthogonal to the vertical faces of the fin sidewalls. While these processes are performed for the silicon fins, the silicon germanium fins are masked off; similarly, when these processes are performed for the silicon germanium fins, the silicon fins are masked off.

It is preferred to have the tensile nitride fill deeper than the Si fin channel. As shown in the figure, the tensile nitride 115 maintains the tension on the Si fins 105 which is beneficial to their functioning. The recess step recesses the STI oxide 111 lower than the bottom of the Si fin channel 105 and above the bottom of the tensile nitride fill 115 in this embodiment, although the precise depth achieved by the recess is not a requirement of the invention. In forming the tensile nitride fill 115, the tensile nitride deposition step is optionally preceded by a thin oxide layer (not pictured) which acts as an adhesion promoter to promote the contact between the silicon fin and the tensile nitride. The thin oxide layer can be deposited by an LPCVD process, with a preferred thickness between 2 to 5 nm, in preferred embodiments of the invention. In alternative embodiments, other process known to the art such as atomic layer deposition, thermal oxidation, chemical oxidation are used to deposit the adhesion layer. The optional adhesion layer is used in embodiments of the invention before the compressive dielectric.

Figure 11:
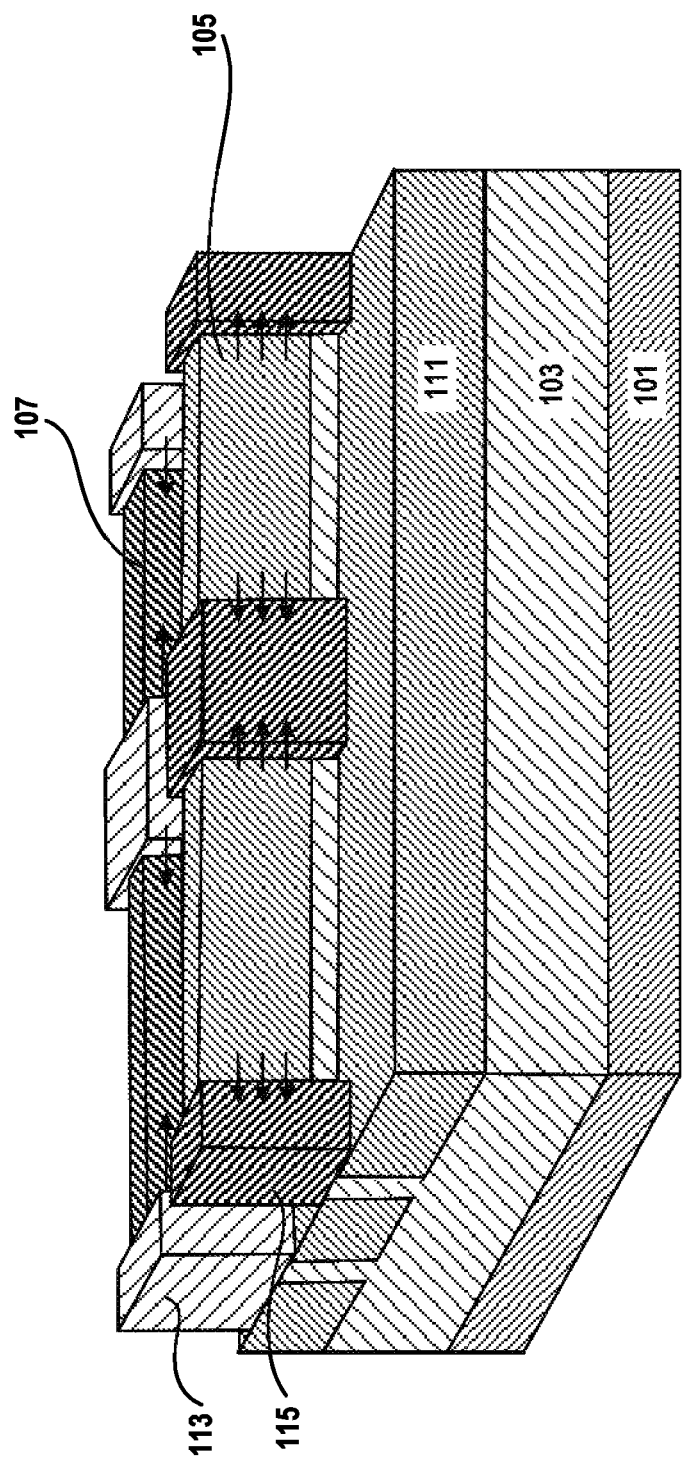
FIG. 11 is a perspective diagram depicting the structure showing both the silicon fins and the silicon germanium fins according to a first embodiment of the invention.

FIG. 11 is a perspective diagram depicting the structure showing both the silicon fins and the silicon germanium fins according to a first embodiment of the invention. The Si fins 105 have tensile nitride fill 115 at fin ends to maintain and enhance tensile strain in Si fins 105 for n-type FinFETs. The SiGe fins 107 have compressive nitride fill 113 at fin ends to maintain and enhance compressive strain in SiGe fins for p-type FinFETs. Arrows in the drawing represent the direction of force exerted on the respective fins 105, 107 by the respective nitride fills 115, 113. In preferred embodiments, the tensile nitride fill 115 and the compressive nitride fill 113 are cut into blocks which bridge between two vertical faces of the silicon or silicon germanium fins.

In alternative embodiments of the invention, rather than bridging between fins, the stress dielectric structure merely caps a fin end. However, it is the inventors' opinion that a complete bridge is more effective in maintaining the strain at the fin ends. Although the illustrated embodiment shows cutting the stress dielectric into blocks, e.g., by an etch step, in alternative embodiments, the stress dielectric structure is left in long strips, where the long strips have faces which contact and preferably bridge between the vertical faces of more than two fins at the fin ends. Those skilled in the art will recognize that other configurations of tensile dielectric structures and compressive dielectric structures which respectively contact the vertical faces of the cut silicon fins or the cut silicon germanium fins can be used to maintain tensile or compressive strain at the fin ends of the cut fins.

The stress dielectric at fin ends compensates the strain relaxation. As a result, the strain along each fin is substantially uniform. For example, if the average strain in each fin is about 0.01, the strain variation (the delta between the maximum strain and the minimum strain along each fin) is less than 0.002.

In preferred embodiments of the invention, at the edge of the device, a "dummy" fin or similar structure is used to anchor a second end of the stress dielectric if another active fin is not available because of the device design.

Processing of additional layers of the integrated circuit device proceeds after the steps illustrated in the disclosure. For example, contacts and wiring could be created using an embodiment of the invention in subsequent steps if required for completion of the integrated circuit.

The resulting structure can be included within integrated circuit chips, which can be distributed by the fabricator in wafer form (that is, as a single wafer that has multiple chips), as a bare die, or in a packaged form. In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While only one or a limited number of features are illustrated in the drawings, those ordinarily skilled in the art would understand that many different types of features could be simultaneously formed with the embodiment herein and the drawings are intended to show simultaneous formation of multiple different types of features. However, the drawings have been simplified to only show a limited number of features for clarity and to allow the reader to more easily recognize the different features illustrated. This is not intended to limit the invention because, as would be understood by those ordinarily skilled in the art, the invention is applicable to structures that include many of each type of feature shown in the drawings.

While the above describes a particular order of operations performed by certain embodiments of the invention, it should be understood that such order is exemplary, as alternative embodiments may perform the operations in a different order, combine certain operations, overlap certain operations, or the like. References in the specification to a given embodiment indicate that the embodiment described may include a particular feature, structure, or characteristic, but every embodiment may not necessarily include the particular feature, structure, or characteristic.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Having described our invention, what we now claim is as follows:

1. A method for fabricating a FinFET device comprising:
    providing a first long silicon fin for n-type FinFET devices and a first long silicon germanium fin for p-type FinFET devices on a strain relaxation buffer (SRB) substrate;
    cutting the first long silicon fin forming a first and a second cut silicon fin, each of the first and second cut silicon fins having a vertical face at a fin end of the respective cut silicon fin, wherein the vertical faces of the first and second cut silicon fins are oriented facing each other;
    cutting the first long silicon germanium fin forming a first and a second cut silicon germanium fins, each of the first and the second cut silicon germanium cut fin having a vertical face at a fin end of the respective cut silicon germanium fin, wherein the vertical faces of the first and second cut silicon germanium fins are oriented facing each other;
    forming a tensile dielectric structure which bridges the vertical faces of the first and second cut silicon fins to maintain tensile strain in the first and second cut silicon fins; and
    forming a compressive dielectric structure which bridges the vertical faces of the first and second cut silicon germanium fins to maintain compressive strain in the first and second cut silicon germanium fins.

2. The method as recited in claim 1, further comprising:
growing an epitaxial silicon layer which is tensily strained for the silicon fins on the SRB substrate; and
growing an epitaxial silicon germanium layer which is compressively strained for the silicon germanium fins on the SRB substrate.

3. The method as recited in claim 1, further comprising:
providing a second long silicon fin for n-type FinFET devices and a second long silicon germanium fin for p-type FinFET devices on a strain relaxation buffer (SRB) substrate;
cutting the second long silicon fin forming a third and a fourth cut silicon fin, the third and fourth cut silicon fins having a vertical face at a fin end of the respective cut silicon fin;
cutting the second long silicon germanium fins forming a third and a fourth cut silicon germanium fins, the third and the fourth cut silicon germanium cut fins having a vertical face at a fin end of the respective cut silicon germanium fin; and
wherein the tensile dielectric structure bridges between the vertical faces of the first, second, third and fourth cut silicon fins and wherein the compressive dielectric structure bridges between the vertical faces of the first, second, third and fourth cut silicon germanium fins.

4. The method as recited in claim 2, wherein cutting the first long silicon fin cuts through the epitaxial silicon layer and into the SRB substrate and cutting the first long silicon germanium fin cuts through the epitaxial silicon germanium layer and into the SRB substrate, and wherein a thickness of the tensile dielectric structure is greater than a thickness of the silicon channels in the first and second silicon fins and a thickness of the compressive dielectric structure is greater than a thickness of the silicon germanium channels in the first and second silicon germanium fins.

5. The method as recited in claim 1, further comprising forming shallow trench isolation between respective fins.

6. The method as recited in claim 1, wherein the tensile dielectric structure is comprised of a tensile silicon nitride and the compressive dielectric structure is comprised of a compressive silicon nitride.

7. The method as recited in claim 1, further comprising:
depositing a shallow trench isolation layer over the first long silicon fin for n-type FinFET devices, the first long silicon germanium fin for p-type FinFET devices and the strain relaxation buffer (SRB) substrate;
performing a planarization step on the shallow trench isolation layer to produce a top surface coplanar with a hardmask layer disposed on the first long silicon fin for n-type FinFET devices and the first long silicon germanium fin for p-type FinFET devices;
forming a first fin cut mask on the top surface for cutting the first long silicon germanium fins wherein the first fin cut mask protects the first long silicon fin; and
forming a second fin cut mask on the top surface for cutting the first long silicon fin, wherein the second fin cut mask protects the first long silicon germanium fin.

8. The method as recited in claim 2, wherein the strain relaxation buffer (SRB) substrate comprises a SiGe layer with a lower atomic percentage of germanium than the epitaxial silicon germanium layer.

9. The method as recited in claim 7, wherein:
cutting the first long silicon fin creates a first trench through the first long silicon fin and neighboring regions of the shallow trench isolation layer;
cutting the first long silicon germanium fin creates a second trench through the first long silicon germanium fin and neighboring regions of the shallow trench isolation layer;
the tensile dielectric structure is formed in the first trench; and
the compressive dielectric structure is formed in the second trench.

10. A method for fabricating a FinFET device comprising:
providing a set of silicon fins for n-type FinFET devices and a set of silicon germanium fins for p-type FinFET devices on a strain relaxation buffer (SRB) substrate;
cutting each fin in the set of silicon fins forming respective pairs of silicon cut fins creating a pair of cut faces for each cut silicon fin, respective cut face at a fin end of a respective cut silicon fin facing another cut face of another cut silicon fin cut from the same silicon fin;
cutting the set of silicon germanium fins forming respective pairs of cut silicon germanium fins creating a pair of cut faces for each silicon germanium fin, respective cut face at a fin end of a respective cut silicon germanium fin facing another cut face of another cut silicon germanium fin cut from the same silicon germanium fin;
forming a set of tensile dielectric structures which respectively bridge the facing cut faces of fin ends of respective pairs of cut silicon fins to maintain tensile strain at the fin ends of the set of cut silicon fins; and
forming a set of compressive dielectric structures which respectively bridge the facing cut faces of respective fin ends of respective pairs of cut silicon germanium fins to maintain compressive strain at the fin ends of the set of cut silicon germanium fins.

11. The method as recited in claim 10, further comprising:
growing an epitaxial silicon layer which is tensily strained for the silicon fins on the SRB substrate; and
growing an epitaxial silicon germanium layer which is compressively strained for the silicon germanium fins on the SRB substrate.

12. The method as recited in claim 10, wherein:
a first and a second cut silicon fins are created from a first silicon fin from the set of silicon fins, a third and a fourth cut silicon fins are created from a second silicon fin from the set of silicon fins;
a first and a second cut silicon germanium fins are created from a first silicon germanium fin from the set of silicon germanium fins, a third and a fourth cut silicon germanium fins are created from a second silicon germanium fin from the set of silicon germanium fins; and
wherein the tensile dielectric structure bridges between the vertical faces of the first, second, third and fourth cut silicon fins and wherein the compressive dielectric structure bridges between the vertical faces of the first, second, third and fourth cut silicon germanium fins.

13. The method as recited in claim 11, wherein cutting the set of silicon fins cuts through the epitaxial silicon layer and into the SRB substrate and cutting the set of silicon germanium fins cuts through the epitaxial silicon germanium layer and into the SRB substrate, and wherein a thickness of the tensile dielectric structure is greater than a thickness of the silicon channels in the set of silicon fins and a thickness of the compressive dielectric structure is greater than a thickness of the silicon germanium channels in the set of silicon germanium fins.

14. The method as recited in claim 10, further comprising forming shallow trench isolation between respective fins.

15. The method as recited in claim 10, wherein the tensile dielectric structure is comprised of a tensile silicon nitride and the compressive dielectric structure is comprised of a compressive silicon nitride.

* * * * *